(12) United States Patent
Solodovnik et al.

(10) Patent No.: US 9,977,858 B2
(45) Date of Patent: May 22, 2018

(54) ELECTROMAGNETIC INTERFERENCE FILTERS FOR POWER CONVERTER APPLICATIONS

(71) Applicant: The Boeing Company, Chicago, IL (US)

(72) Inventors: Eugene V. Solodovnik, Lake Stevens, WA (US); Kamiar J. Karimi, Kirkland, WA (US)

(73) Assignee: THE BOEING COMPANY, Chicago, IL (US)

( * ) Notice: Subject to any disclaimer, the term of this patent is extended or adjusted under 35 U.S.C. 154(b) by 716 days.

(21) Appl. No.: 14/323,296

(22) Filed: Jul. 3, 2014

(65) Prior Publication Data

US 2016/0004810 A1 Jan. 7, 2016

(51) Int. Cl.
| G06F 17/50 | (2006.01) |
| H02M 1/44 | (2007.01) |
| H02P 27/16 | (2006.01) |

(52) U.S. Cl.
CPC .......... *G06F 17/5086* (2013.01); *H02M 1/44* (2013.01); *H02P 27/16* (2013.01); *Y02T 10/82* (2013.01)

(58) Field of Classification Search
CPC combination set(s) only.
See application file for complete search history.

(56) References Cited

U.S. PATENT DOCUMENTS

| 5,483,136 A * | 1/1996 | Marcinkiewicz | H02M 1/44 318/558 |
| 6,697,270 B1 | 2/2004 | Kalman et al. | |
| 6,791,204 B2 * | 9/2004 | Sarlioglu | H02P 9/08 290/47 |
| 6,943,524 B2 * | 9/2005 | Branecky | H02P 25/089 318/400.01 |
| 7,388,766 B2 * | 6/2008 | Baumgart | H02M 1/12 323/207 |

(Continued)

FOREIGN PATENT DOCUMENTS

| CN | 1571261 A | 1/2005 |
| CN | 1906837 A | 1/2007 |

(Continued)

OTHER PUBLICATIONS

Shuo Wang et al., Investigation of Hybrid EMI Filters for Common-Mode EMI Suppression in a Motor Drive System, IEEE Transactions on Power Electronics, vol. 25, No. 4, Apr. 2010, 1034-1045.*

(Continued)

*Primary Examiner* — Omar Fernandez Rivas
*Assistant Examiner* — Justin C Mikowski
(74) *Attorney, Agent, or Firm* — Patterson + Sheridan, LLP

(57) ABSTRACT

Methods, computer-readable storage mediums and systems provide for designing a motor drive power system including switching mode power conversion equipment. According to aspects of the disclosure, a resonant point is shifted to a shifted resonant point by changing impedance of at least one of a feeder or a motor. An EMI filter is designed for the shifted resonant point that is at a higher frequency such that the EMI filter for the shifted resonant point is lighter as compared to an EMI filter designed for the resonant point before it is shifted.

20 Claims, 7 Drawing Sheets

(56) References Cited

U.S. PATENT DOCUMENTS

| | | | | |
|---|---|---|---|---|
| 7,446,498 | B2* | 11/2008 | Cheng | H02P 6/15 318/400.38 |
| 8,115,366 | B2* | 2/2012 | Hoffman | B06B 1/0261 310/316.01 |
| 2007/0159860 | A1 | 7/2007 | Haeberle et al. | |
| 2008/0211478 | A1* | 9/2008 | Hussman | H02M 3/3374 323/355 |
| 2010/0102672 | A1 | 4/2010 | Hoffman et al. | |

FOREIGN PATENT DOCUMENTS

| | | |
|---|---|---|
| CN | 101119097 A | 2/2008 |
| CN | 101661827 A | 3/2010 |
| CN | 202258087 U | 5/2012 |
| CN | 202309182 U | 7/2012 |
| CN | 103066915 A | 4/2013 |
| JP | 2007533290 A | 11/2007 |
| JP | 2010073900 A | 4/2010 |
| JP | 2013021837 A | 1/2013 |
| JP | 201321837 A | 2/2013 |
| JP | 2014170202 A | 9/2014 |
| RU | 2508589 C2 | 2/2014 |
| WO | 1993020523 A1 | 10/1993 |

OTHER PUBLICATIONS

Chinese Office Action for Application 201510381351.6 dated Dec. 27, 2017 (English Translation) (Year: 2017).*
European Search Report for EP 15162689, dated May 3, 2016.
Chinese Office Action for Application Dated 201510381351.6 dated Dec. 27, 2017.
"Power Electronic Device and Converter Technology Q & A", Zhe Chen, Northeastern University Press, Nov. 2009, 1st Edition. (English Abstract Unavailable).

\* cited by examiner

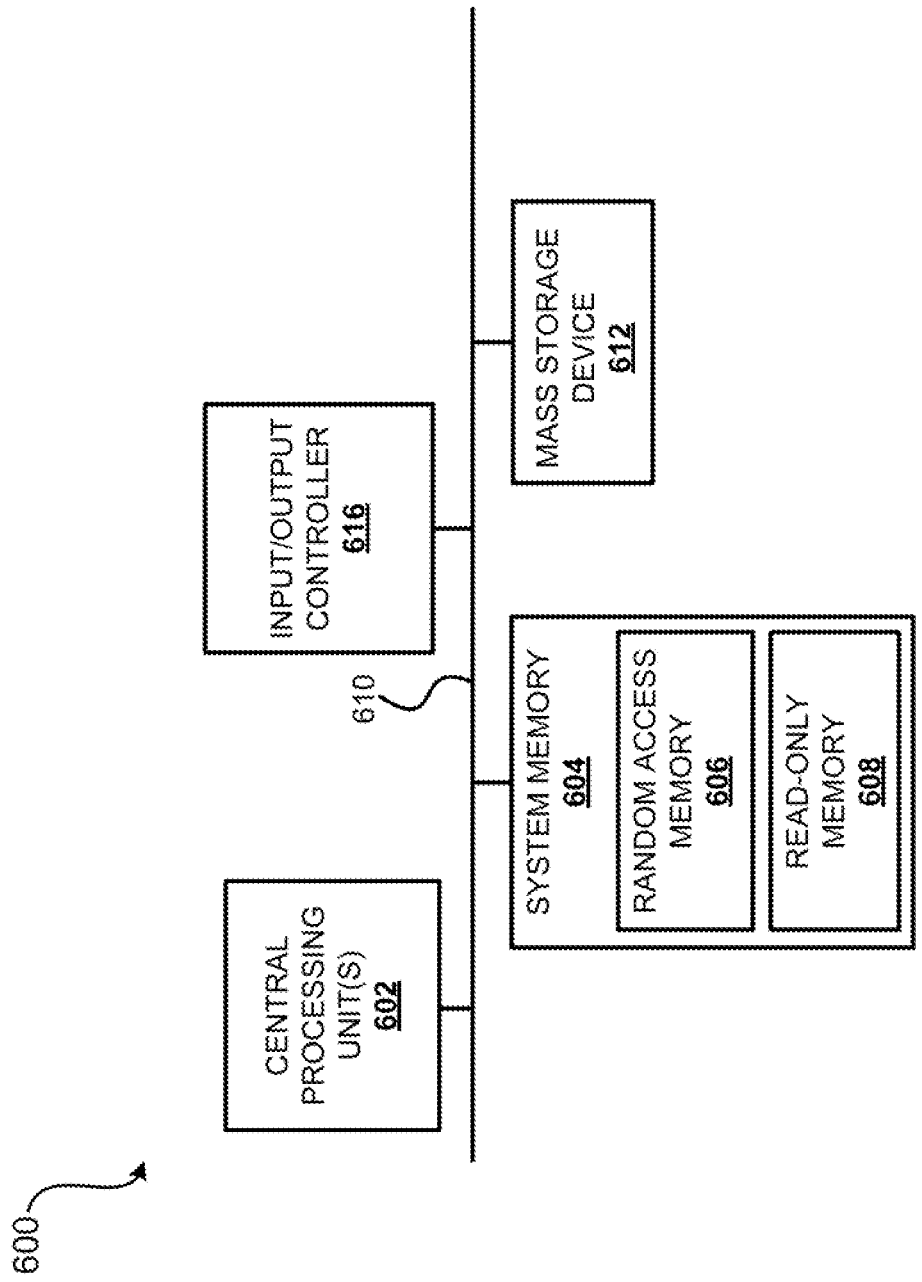

ELECTROMAGNETIC INTERFERENCE FILTERS FOR POWER CONVERTER APPLICATIONS

BACKGROUND

Commercial aircraft may generate and use a large amount of electrical power. For example, a large passenger or cargo airplane might generate over one megawatt of electrical power from its main engine sources. This power needs to be conditioned to be used by various users of power by Power Conversion Units (PCUs) and motor controllers.

The PCUs might convert an airplane's variable frequency high or medium voltage power to different frequencies and/or voltages. For example, a low voltage might be produced for powering equipment (e.g., lights, galley, cooling fans). High Voltage DC (HVDC) might also be produced to power large motor controller equipment to power hydraulic pumps, and various types of compressors. Low voltage DC (LVDC) might be produced to power avionics equipment and medium voltage DC (MVDC) might be powered to power electric brakes. One mechanism that might be used for power conversion is switching power converters that use Pulse Width Modulated (PWM) techniques.

Switching power converters that may be employed in the PCUs use a switching action that generates electromagnetic interference (EMI) noise that might interfere with normal operation of the aircraft (e.g., aircraft radio and navigational equipment). In order to help control this unwanted EMI noise, EMI filters are employed within the PCUs and motor drive systems. In some aerospace applications, such as on airplanes, EMI filters might account for 50% (or even more) of weight and volume in the power converters. EMI filter design for power conversion equipment for airplanes, or other aerospace applications, can be challenging due to stringent EMI requirements and volume and weight constraints that might be imposed on the power conversion and motor control equipment.

SUMMARY

It should be appreciated that this Summary is provided to introduce a selection of concepts in a simplified form that are further described below in the Detailed Description. This Summary is not intended to be used to limit the scope of the claimed subject matter.

Methods, computer-readable storage medium, and apparatus described herein are directed at designing a motor drive power system that includes switching mode power conversion equipment. According to an aspect, a method is provided to design EMI filters for switching mode power conversion equipment that might be used in aerospace applications. The method includes determining a motor drive system that includes a motor controller and a feeder that couples the motor controller to an electric motor. A resonant point for the motor drive system is determined and is shifted to a shifted resonant point for the motor drive system that is at a higher frequency as compared to the original resonant point. An EMI filter is designed for the shifted resonant point that is included in the motor drive system.

According to yet another aspect, a system is provided that includes an EMI filter designed for a shifted resonant point that has been shifted from a resonant point associated with a lower frequency. The system includes one or more motor controllers, one or more feeders coupled to the one or more motor controllers and one or more EMI filters that are coupled to at least one of the motor controllers. The feeders are designed based at least in part on an impedance specification that moves a resonant point of a combined impedance of the one or more feeders and one or more electric motors to the shifted resonant point. The EMI filters are designed based at least in part on the shifted resonant point.

According to another aspect, a computer-readable storage medium is provided for designing a motor drive power system that includes switching mode power conversion equipment. The computer-readable medium includes computer-executable instructions stored thereon that, when executed by a computer comprising hardware and software, cause the computer to perform actions. The instructions cause the computer to access a motor drive system specification that includes a motor controller model and a feeder model. The instructions also cause the computer to determine a resonant point for the motor drive system and determine impedance specifications to shift the resonant point for the motor drive system to a higher frequency to a shifted resonant point. The instructions are used to design an electromagnetic interference (EMI) filter for the shifted resonant point.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

FIG. 6 illustrates a computer in which a motor drive system may be designed according to various embodiments presented herein.

Figure 1:
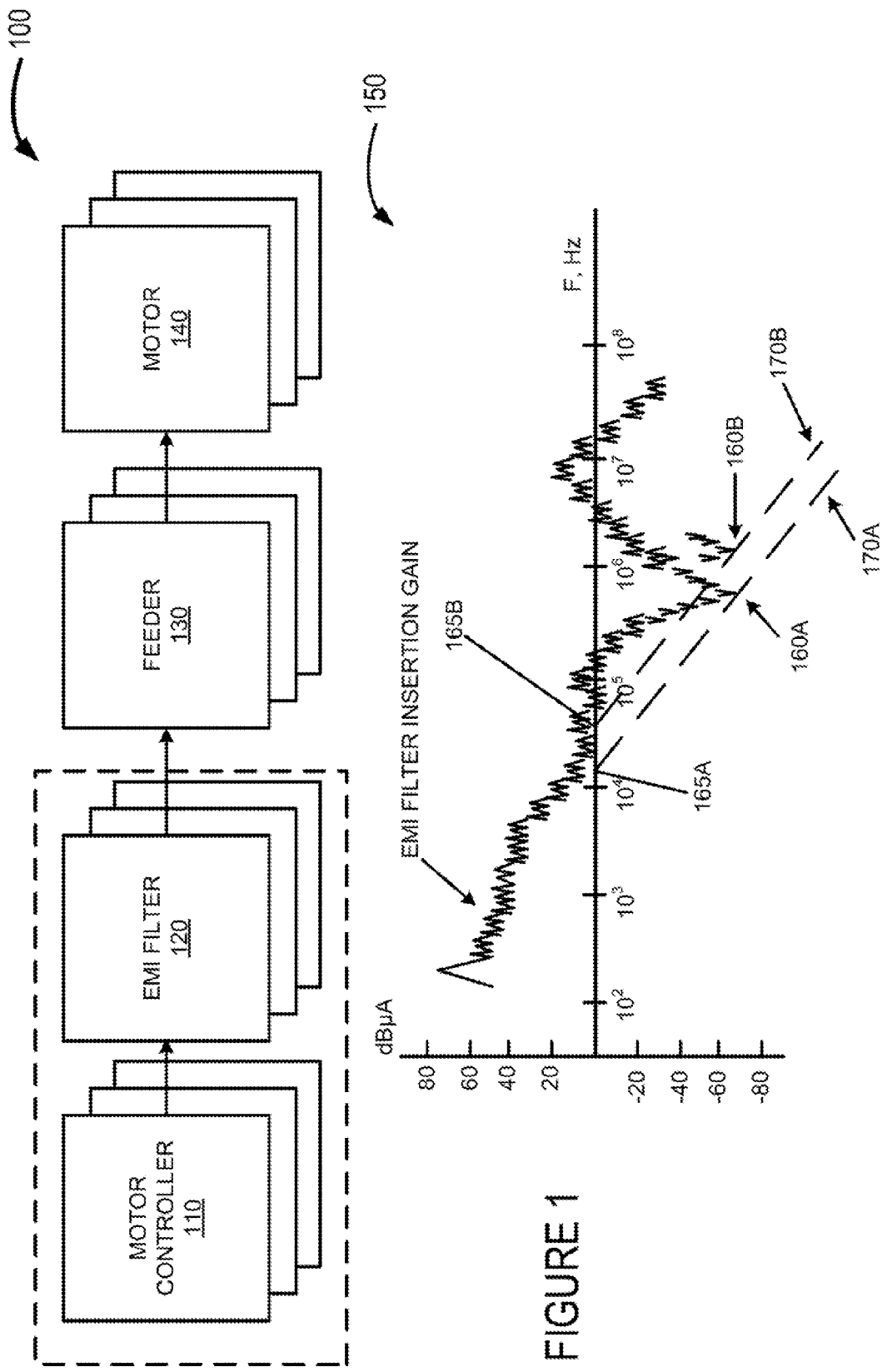
FIG. 1 illustrates a motor drive system and an EMI filter insertion gain graph showing a resonant point and a shifted resonant point.

Each figure shown in this disclosure shows a variation of an aspect of the embodiment presented, and only differences will be discussed in detail.

DETAILED DESCRIPTION

The following detailed description is directed to designing a motor drive power system that includes switching mode power conversion equipment. In one example, EMI filters that are included in the motor drive power system are designed for higher frequency switching such that they are lower in weight as compared to similar EMI filters that are used in aerospace applications.

Utilizing the concepts and technologies described herein, EMI filters are designed for switching mode power conversion equipment for aerospace applications based on a shifted resonant point that is at a higher frequency as compared to an original resonant point. Designing an EMI filter based on a shifted resonant point may reduce the weight of the EMI filter since the weight of an EMI filter is affected by the components (e.g., inductors, capacitors) that are included in the EMI filter. Generally, the weight of the EMI filter may be reduced by shifting the filtering of the EMI filter to a higher frequency. During the design process of a motor drive system, different motor drive system configurations may be tested (e.g., simulated) to determine specifications (e.g., desired impedances) that may be used when developing the feeders and the motors that are included in the motor drive system.

In the following detailed description, references are made to the accompanying drawings that form a part hereof, and which are shown by way of illustration, specific embodiments, or examples. Referring now to the drawings, in which like numerals represent like elements through the several figures, a configurable tray table and method for employing the same according to the various embodiments will be described.

Referring now to FIG. 1, a motor drive system 100 is illustrated with an EMI filter insertion gain graph 150 showing a resonant point 160A and a shifted resonant point 160B. As illustrated, the motor drive system 100 includes one or more motor controllers 110, one or more EMI filters 120, one or more feeders 130 and one more motors 140. Generally, the motor controllers 110, the EMI filters 120, the feeders 130 and the motors 140 are configured and changed based on the application where they are used. For example, the motor controllers 110, the EMI filters 120, the feeders 130 and the motors 140 are typically different from one airplane design to another airplane design.

As discussed briefly above, the EMI filters 120 that are part of the motor drive system 100 may account for a large percentage of the weight (e.g., >50%) of the motor drive system 100. An EMI filter 120 is generally designed such that it meets specified EMI requirements that are part of Aerospace standards. In the current example, one or more of the EMI filters 120 are designed based on a shifted resonant point 160B that is shifted to a higher frequency as compared to the original resonant point 160A. The weight and volume of an EMI filter 120 might be reduced by avoiding or adjusting resonances between the motor controllers 110, the feeders 130 and the motors 140. In one example, an EMI filter 120 may be designed based on a worst case bare EMI noise that is produced by an associated motor controller 110. The EMI filters 120 might also be designed for other scenarios and EMI specifications. For example, the EMI filters 120 might be designed for other EMI specifications that might not be as stringent as a worst case scenario.

In one example, the motor controllers 110 might control different motors 140 that perform different operations. For example, one of the motors 140 might control hydraulic pumps whereas another of the motors 140 might drive air compressors. Other motors might be configured to perform other operations. Each of the motors 140 are coupled to a motor controller 110 by a feeder 130.

Generally, a feeder 130 comprises one or more cables that provide power and possibly other information to the motors 140. A feeder 130 might be modeled by inductors and capacitors that provides a transfer function that includes resonance points. The feeders 130 and the motors 140 each have an impedance associated with them. In examples, the motors 140 are provided by one supplier and the feeders 130 are provided by a different supplier. As discussed herein, specifications for the feeders 130 and the motors 140 are determined and provided to the supplier such that the feeders 130 and the motors 140 that are supplied meet the provided specifications. The specifications for the feeders 130 and the motors are based on the shifted resonant point 160B such that the weight of the EMI filter 120 may be reduced.

In more detail, resonances exist between the motor controllers 110, the feeders 130 and the motors 140 that can amplify noise at particular frequencies. This amplification affects the design and weight of the EMI filters 120. The EMI filter insertion gain graph 150 illustrates how resonance points affect EMI filter corner frequency.

Insertion gain may be calculated by subtracting the bare noise of the power converter from the EMI specifications (e.g., the DO-160 environmental Conditions and Test Procedures for Airborne Equipment standard, or some other standard or specification). For purposes of explanation, assume that an L-C filter (e.g., an Inductor-Capacitor filter) provides 40 dB/decade attenuation as illustrated by the dashed line 170A and by the dashed line 170B.

In the illustrated example, a corner frequency ($f_c=1/2\pi\sqrt{LC}$) 165A of the filter may be obtained by drawing the dashed line 170A with slope of −40 dB/decade from the worst case resonant point 160A until it intersects with the frequency axis. This helps to ensure that filter attenuation is sufficient even at a worst resonant point and therefore the specified EMI requirement is met. It can be seen by referring to the EMI filter insertion gain graph 150 that if a resonant point has a lower magnitude or occurs at a higher frequency, the corner frequency of the filter can be moved to higher frequency. In the current example, the corner frequency 165A is moved to the corner frequency 165B. Generally, a higher corner frequency of an EMI filter 120 translates into lower value of inductance and capacitance that is used to implement an EMI filter 120. Lower inductance and capacitance values typically correspond to smaller, lighter and more efficient EMI filter 120 designs.

The bare noise (or insertion gain) resonant points depend on the feeder and motor inductances and capacitances. Therefore, by levying impedance specifications for the feeders 130 and the motors 140, the resonance points might be eliminated or shifted (e.g., from original resonant point 160A to shifted resonant point 160B), thus reducing the weight of the EMI filter 120.

Other mechanisms might also be used to reduce the weight of a motor drive system, such as the motor drive system 100. For example, a combination of impedance requirements might be levied on cable and motor suppliers along with placing lightweight passive components along the cable can be used in the design of the EMI filters 120 for the motor controllers 110. For example, the lightweight passive elements (e.g., such as ferrite beads) might be placed along the feeders 130 at various places and possibly close to the motor terminals. These lightweight passive elements may shift the resonance points between the feeders 130 and the motors 140. Generally, a ferrite bead is an electrical component that suppresses high frequency noise in electronic circuits. A ferrite bead may be used to reduce interference from a device or to a device. This lightweight passive elements mechanism might be used in addition to the shifting of the resonant point by specifying how the feeders 130 or the motors 140 are designed.

Generally, any mechanism that reshapes the impedance of the motor/feeder system, shift resonances to higher frequencies, might be examined to determine if the weight of the motor drive system 100 is reduced to a desired weight and/or to determine if the filtering requirements of the EMI filters 120 are reduced (e.g., filtering at a higher frequency). In another example, shielding on a feeder 130 might be used to reduce the weight of an EMI filter 120. Shielding that is sparse may minimally increase the weight of the feeder 130 but it may make the weight of the EMI filter 120 for a motor controller 110 significantly lighter. Studies can be performed to determine a density of the feeder shielding in an attempt to optimize the weight of the motor drive system 100.

Figure 3:
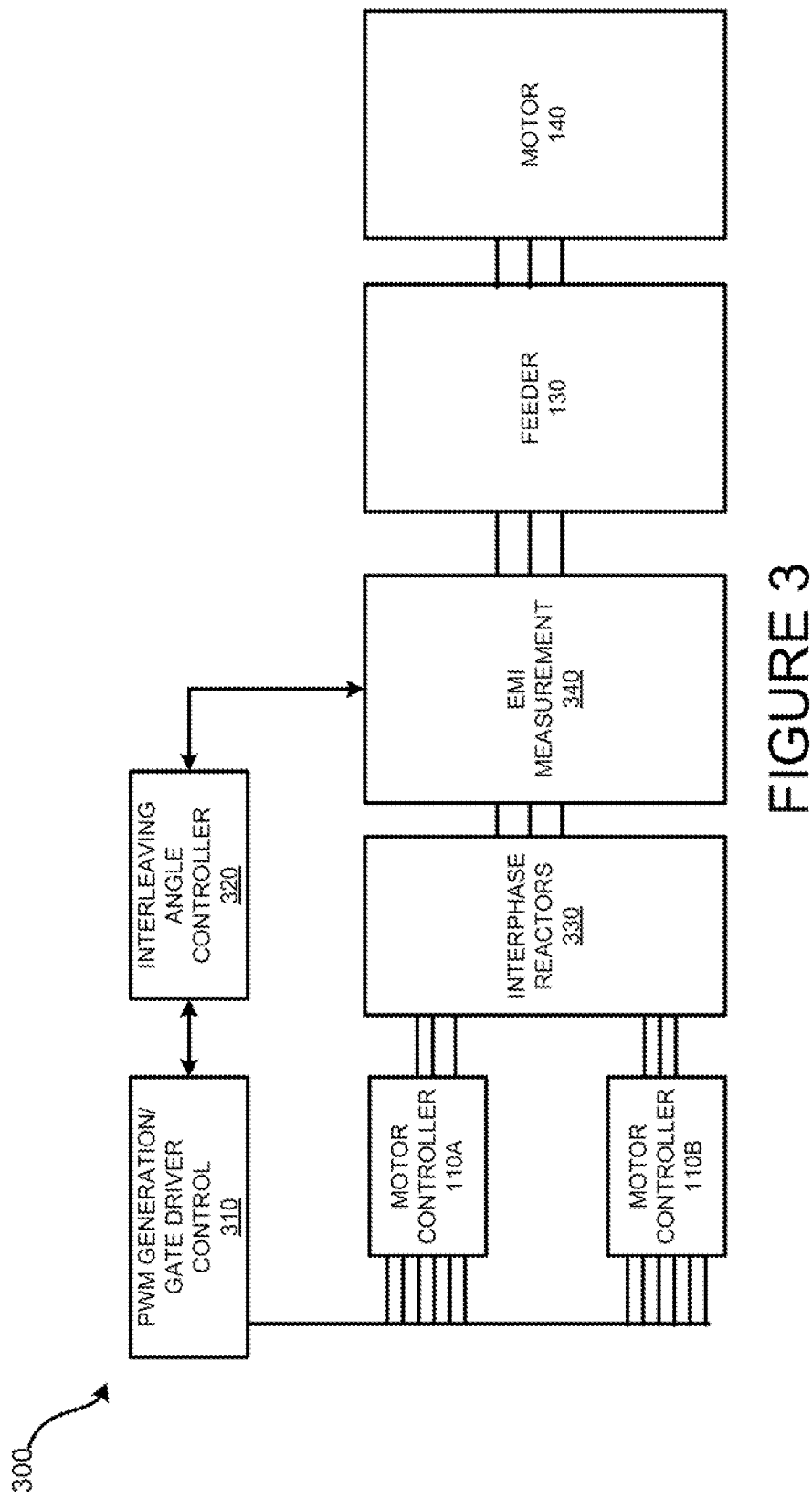
FIG. 3 shows a block diagram of a control system that measures conducted EMI at an output of a motor controller and includes an interleaving angle controller.

Another mechanism that might be used to reduce the overall weight of the motor drive system 100 uses interleaved motor controllers (e.g., See FIG. 3). If the motor drive system 100 uses interleaved motor controllers, interphase reactors are used according to an embodiment. The interphase reactors (which add weight to the motor drive system 100) are used for reducing circulating currents between inverters of the motor controllers 110. Generally, interleaving allows for selective reduction of EMI noise depending on a selected interleaving angle. Traditional 180 degree interleaving eliminates odd harmonics in the output waveform. Interleaving at different angles does not completely eliminate odd harmonics but attenuates them. The even harmonics are also attenuated.

Figure 2:
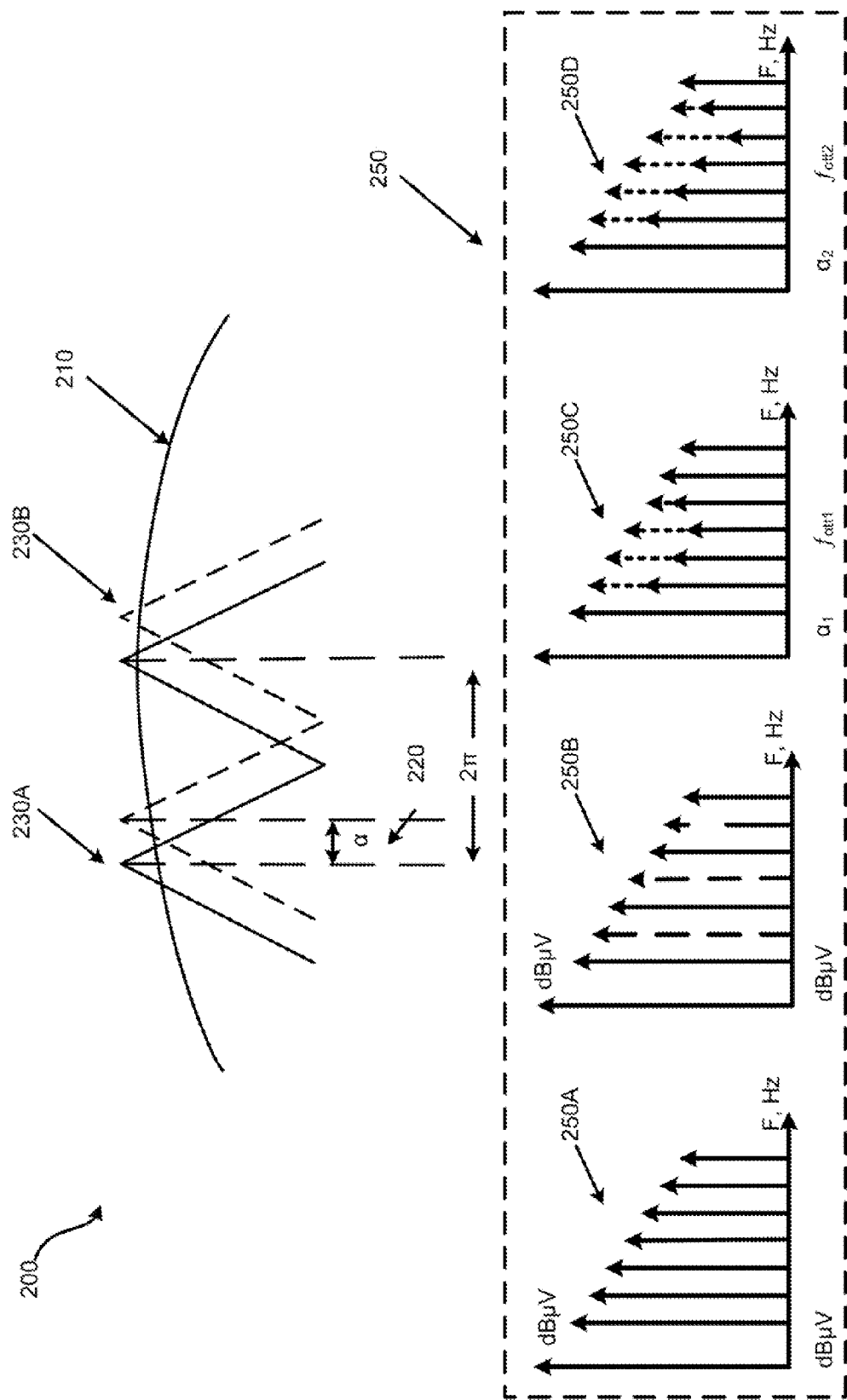
FIG. 2 illustrates the interleaving of two inverters with a variable interleaving angle and bare noise reduction at particular frequencies when specific interleaving angle is used.

FIG. 2 illustrates the interleaving of two inverters with a variable interleaving angle and bare noise reduction at particular frequencies when specific interleaving angle is used. In the illustrated example, two inverters generate the same sinusoidal reference signal 210. A carrier signal (e.g., carrier signal 230A), which is used to generate PWM, however, is phase shifted to an arbitrary angle $\alpha$ 220 as shown by carrier signal 230B. As discussed briefly above, a motor controller 110 might be configured as an interleaved motor controller. The interleaving angle $\alpha$ 220 might be selected based on the determined resonance points for the motor drive system 100. For example, the interleaving angle $\alpha$ 220 may be selected based on a type of the feeder 130 being used. For instance, a 15 degree interleaving angle $\alpha$ 220 might be used for a feeder 130 in order to reduce EMI, whereas a 20 degree interleaving angle $\alpha$ 220, or some other interleaving angle, might be used to reduce the EMI for a different feeder 130.

Bare noise reductions 250 illustrate example graphs of bare noise reduction at particular frequencies when a specific interleaving angle is used. An interleaving angle might be selected such that bare noise generated by interleaved motor controller is minimal at the resonant frequency point of the feeder 130 and/or the motor 140. By doing so, filter attenuation requirements might be relaxed and the EMI filter corner frequency might be shifted to a higher frequency, which may lead to a lighter filter design.

The bare noise graph 250A shows no interleaving being used. The bare noise graph 250B shows 180 degree interleaving being used that eliminates the odd harmonics. The bare noise graph 250C shows a first interleaving angle being used that attenuates the harmonics at a specific frequency. The bare noise graph 250D shows a second interleaving angle being used that attenuates the harmonics at a specific frequency. While harmonics are not eliminated as in the 180 degree interleaving that is shown in the bare noise graph 250B, the bare noise graph 250C and the bare noise graph 250D show that the harmonics are reduced. As discussed herein, reducing the harmonics at the resonant frequency may reduce the weight of an EMI filter 120. A motor drive system, such as the motor drive system 300 shown in FIG. 3, might adjust interleaving angles in response to a change of modes of a motor controller, such as when a multifunctional motor controller switches modes.

Multifunctional motor controllers are often employed in aerospace applications. For example, multifunctional motor controllers may be one type of a motor controller 110 that might be employed on an airplane. Multifunctional motor controllers are operative to drive different loads at different times. For example, the same motor controller 110 may be configured to drive a hydraulic pump at one time and power a nitrogen generation compressor at a different time.

Multifunctional motor controllers 110 typically have different feeders 130 and different motors 140 and therefore have different resonances that are considered during EMI filter design. Hence, design of a multifunctional motor controller with a single fixed interleaving angle may not be always possible. In this case, design of a closed loop control system that measures conducted EMI at motor controller output and adjusts interleaving angle to minimize EMI can be employed.

When multifunctional motor controller changes its operating mode from one application to another, the interleaving angle is swept while conducted EMI is measured. Then, the interleaving angle when minimum conducted EMI is achieved is selected for further operation of the motor controller in this particular operating mode.

FIG. 3 shows a block diagram a motor drive system 300 that measures conducted EMI at an output of a motor controller 110 and includes an interleaving angle controller 320. As illustrated, the motor drive system 300 includes a PWM generation/gate driver control 310, an interleaving angle controller 320, motor controller 110A, motor controller 110B, interphase reactors 330, EMI measurement 340, one or more feeders 130 and one or more motors 140.

One mechanism that might be used to reduce EMI is by changing an interleaving angle through an open loop control using the interleaving angle controller 320. For instance, for each operating mode of a multifunctional motor controller 130A and motor controller 110B an interleaving angle is calculated at the design stage or measured by the EMI measurement component 340 during the operation of the motor drive system 300 that reduces the EMI of the motor drive system 300.

In the current example, the multifunctional motor controller 110 has six different operating modes. More or less operating modes by be configured. During the operation of the motor drive system 200, when the operating mode of a motor controller 110 changes, the interleaving angle (e.g., pre-calculated or dynamically determined by the interleaving angle controller 320) that reduce the EMI for a particular operating mode is selected or determined and used for driving the motor 140. For example, the interleaving angle controller 320 determines the interleaving angle for the current mode and provides the interleaving angle to the PWM generation/gate driver control 310 to control the motor controllers 110. As discussed herein, the interleaving angle that is used within the motor drive system 300 may be set one time (e.g., at design time, or upon startup) or dynamically change during operation. For example, before the motor controller switches to a different mode, the interleaving angle may be determined.

Active approaches can also be used for EMI bare noise reduction. Traditionally, active approach utilizes EMI measurement circuit and a power amplifier that injects measured EMI noise via capacitive or inductive coupling back into power line with opposite phase. This approach allows for canceling out EMI noise at low frequencies. This low frequency limitation is due at least in part to an inability of a power amplifier to cover wide frequency spectrum that ranges from low to high frequencies. Typically, when an active EMI approach is used, a passive high frequency EMI filter 120 is still used. As discussed above, an EMI filter 120 that is designed for attenuating low frequencies is heavier as compared to an EMI filter 120 that is designed for attenuating higher frequencies.

Figure 4:
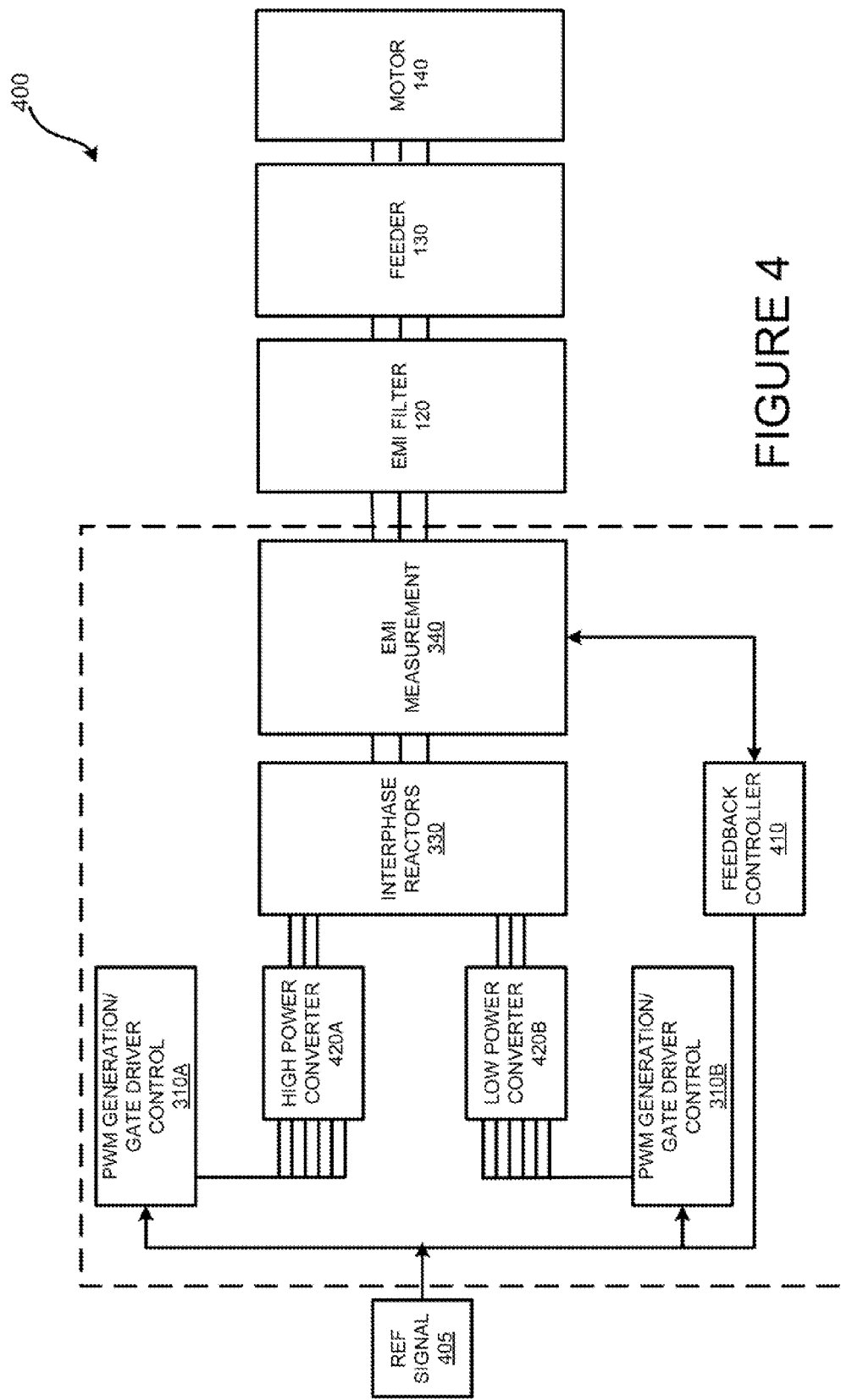
FIG. 4 illustrates an active EMI filter motor drive system.

FIG. 4 illustrates an active EMI filter motor drive system 400. As illustrated, the active EMI filter motor drive system 400 includes a reference signal 405, a PWM generation/gate driver control 310A and a PWM generation/gate driver control 310B, a high power converter 420A, a low power converter 420B, feedback controller 410, interphase reactors 330, EMI measurement 340, one or more EMI filters 120, one or more feeders 130 and one or more motors 140.

As illustrated, the active EMI filter motor drive system 400 does not include injection devices that are typically used in active EMI filter systems. As shown, active EMI filter motor drive system 400 includes two power converters (high power converter 420A and low power converter 420B in parallel. A high power converter 420A might use Insulated Gate Bipolar Transistors (IGBTs) that have relatively slow turn on and turn off times and switch at relatively low frequencies (e.g., 10 kHz to 20 kHz). In contrast, a low power converter 420B may utilize devices capable of high frequency switching such as SiC MOSFETs or GaN FETs. These low power devices can switch at frequencies close to EMI range (i.e. hundreds of kHz).

In one example, the parallel converters (e.g., high power converter 420A and low power converter 420B) generate the same reference waveform signal, but the reference signal of the low power converter 420B and high frequency capable converter also contains EMI feedback that modifies its reference to effectively cancel out EMI bare noise generated by converter switching at a low frequency. Since the low power converter 420B is operative to switch at higher frequencies as compared the high power converter 420A, the low power converter 420B is operative to reproduce relatively high frequency EMI content in its reference. The feedback controller 410 is used to help control the operation of the PWM generation/gate driver controls 310. As illustrated, the EMI filter 120 is a passive high frequency that is low in weight.

As illustrated herein, many different mechanisms might be used to reduce the weight of a motor drive system that also reduces EMI. As such, one or more of the different mechanisms might be used or combined to create or design a motor drive system that reduces the weight of the system. EMI reduction and power converter EMI filter design described herein may assist in minimizing and optimizing a weight of a motor drive system used in aerospace applications, or other applications.

Figure 5A:
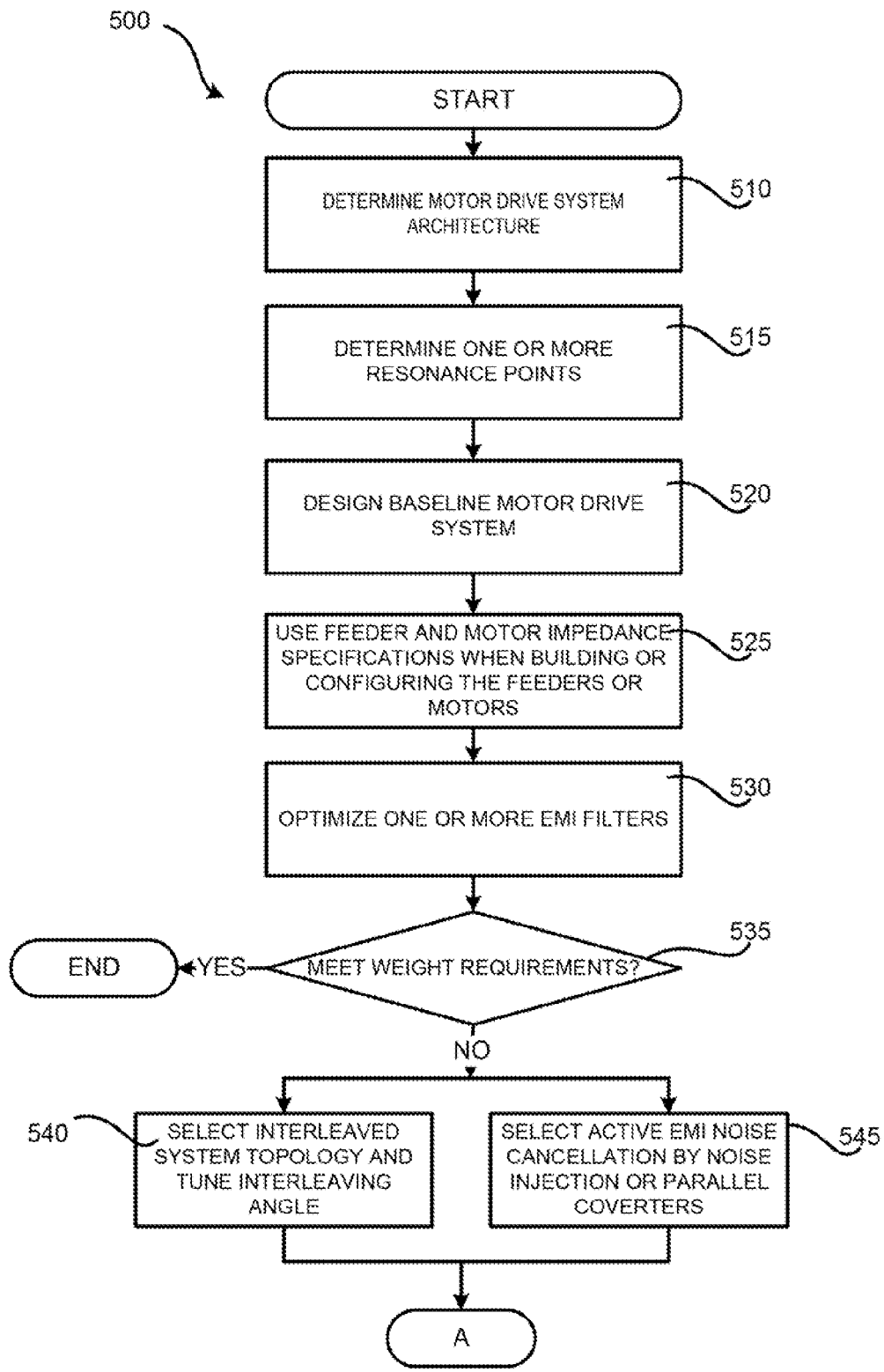
FIG. 5A and FIG. 5B show an illustrative routine to design a motor drive system that reduces EMI.
Figure 5B:
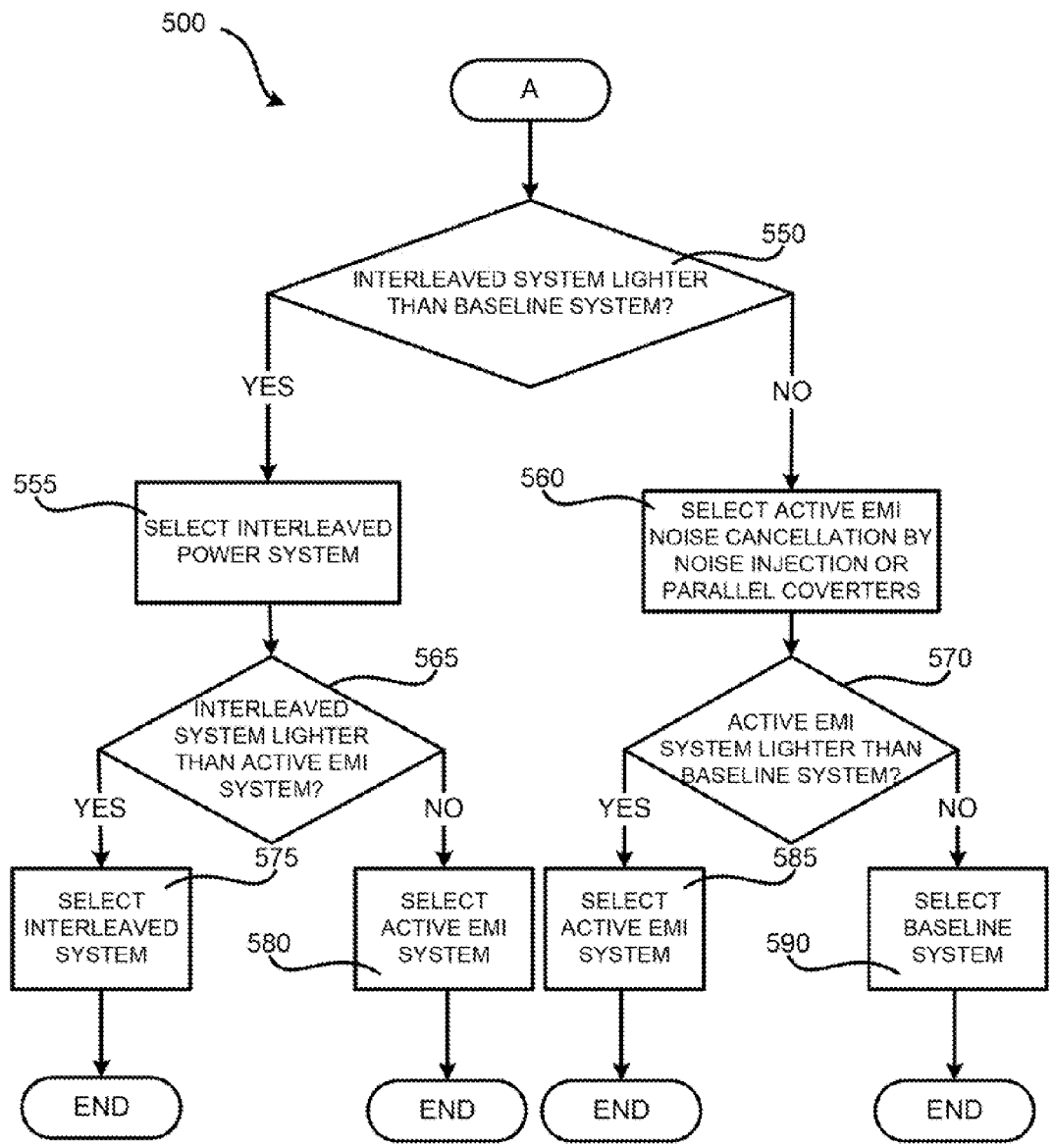

Turning now to FIGS. 5A and 5B, an illustrative routine 500 is described to design a motor drive system that reduces EMI. It should be appreciated that more or fewer operations may be performed than shown in the figures and described herein. These operations may also be performed in a different order than those described herein. In some examples, some of the operations may not be performed.

The routine 500 might begin at operation 510 as shown in FIG. 5A, where the motor drive system architecture is determined. As discussed above, the motor drive system architecture may include a variety of power conversion equipment and motor controllers depending on the specific application of the motor drive system. Generally, the motor drive system architecture defines how many motor controllers 110 are used, how many modes each motor controller 110 includes, how many motors 140 are in the motor drive system, and the like. The determined motor drive system architecture might also specify motor controller 110 locations, lengths and types of feeders 130, motor specifications for the motors 140, and the like. In one example, the motor drive system architecture is determined for an airplane. The motor drive system architecture that is determined, however, may be for any type of application. For example, the motor drive system architecture may be for a satellite, a boat, a train, a land-based system, a space-based system, and the like.

From operation 510, the routine 500 might continue to operation 515, where one or more resonance points might be determined. As discussed above, impedances of the feeders 130 and the motors 140 may be determined based on the determined motor drive system architecture and used to determine the resonance points.

From operation 515, the routine 500 might continue to operation 520, where a baseline motor drive system is designed. For example, a pulse-width modulation (PWM) mechanism might be designed and the EMI filters insertion gain and corner frequency may be determined. The feeder and motor impedance EMI requirements may also be determined that eliminate, reduce or shift the resonance points to reduce or minimize the weight of one or more EMI filters 120 that are used within the motor drive system.

From operation 520, the routine 500 might flow to operation 525, where feeder and motor impedance specifications are used when building or configuring the feeders 130 and/or the motors 140. In some examples, the feeder and motor impedance specifications are communicated to one or more suppliers of the feeders 130, motor controllers 110 and motors 140. In some cases, these provided impedance specifications might be modified by the suppliers, the designer, or some other authorized user (e.g., a provided impedance specification is unattainable). These feeder and motor impedance specifications are used (e.g., by the supplier) when building or configuring the feeders 130 and the motors 140 such that at least one resonant point is shifted to a higher frequency.

From operation 525, the routine 500 flows to operation 530, where one or more of the EMI filters 120 might be optimized. For example, as discussed above, an EMI filter 120 might be optimized by including shielding or adding passives (e.g., ferrite beads) for a feeder 130. An optimization that is selected might be based on what optimization makes the EMI filter 120 lighter. For example, in one example, shielding for a feeder 130 may be lighter whereas in another example, the addition of light passives comprising small capacitor or ferrite bead along the feeder 130 may result in a lighter motor drive system. In another example, it may be determined to not include either shielding or light passives for the feeders 130.

From operation 530, the routine 500 might flow to decision operation 535, where a decision is made as to whether the EMI filter 120 and/or the motor drive system meets the specified weight requirements. In response to meeting the weight requirements, the routine 500 might flow to an end operation. In response to not meeting the weight requirements, the routine 500 might flow to operation 540 and to operation 545.

At operation 540, an interleaved power controller might be selected and the combined impedance of the feeder and the motor may be calculated (e.g., using a simulation) or are measured (e.g., from a prototype) in the conducted EMI frequency range to determine the resonance points. The interleaving angle may also be tuned to reduce the noise at the feeder/motor impedance resonance points. As discussed above, the interleaving angle may be dynamically adjusted by an interleaving angle controller (e.g., when a multifunctional motor controller is used).

At operation 545, an active EMI noise cancellation mechanism might be selected. As discussed above, the EMI cancellation mechanism might include noise injection or converter paralleling depending on which mechanism results in a lighter designed. For example, when the noise injection mechanism is determined to result in a lighter design, the active EMI cancellation by out-of-phase noise injection might be selected. When the noise injection mechanism is not lighter than the parallel converters, an active EMI cancellation by the converter paralleling might be selected.

From operation 540 and operation 545, the routine 500 might flow to decision operation 550 as illustrated on FIG. 5B, where a determination is made as to whether the interleaved system is lighter than the baseline system as specified in operation 520. In response to the interleaved system being lighter than the baseline system, the routine 500 might flow to operation 555. In response to the interleaved system not being lighter than the baseline system, the routine 500 might flow to operation 560.

At operation 555, the interleaved motor drive system is selected. From operation 555, the routine 500 might flow to decision operation 565 where a determination is made as to whether the interleaved system is lighter than the active EMI system. In response to the interleaved system being lighter than the active EMI system, the routine 500 might flow to operation 575 where the interleaved system might be selected. In response to the interleaved system not being lighter than the active EMI system, the routine 500 might flow to operation 580 where the active EMI system might be selected.

At operation 560, the active EMI system might be selected. From operation 560, the routine 500 might flow to decision operation 570 where a determination is made as to whether the active EMI system is lighter than the baseline system. In response to the active EMI system being lighter than the baseline system, the routine 500 might flow to operation 585 where the active EMI system might be selected. In response to the active EMI system not being lighter than the baseline system, the routine 500 might flow to operation 590 where the baseline system might be selected. The routine 500 might then flow to an end operation or return to processing other actions. For example, the routine 500 may return to operation 510.

FIG. 6 illustrates a computer comprising hardware and software, in which a motor drive system may be designed. The computer 600 illustrated in FIG. 6 includes one or more central processing unit(s) ("CPUs") 602, a system memory 604, including a random-access memory ("RAM") 606 and a read-only memory ("ROM") 608, and a system bus 610 that couples the system memory 604 to the CPU 602. A basic input/output system containing the routines that help to transfer information between elements within the computer 600, such as during startup, may be stored in the ROM 608.

The CPUs 602 may be standard programmable processors that perform arithmetic and logical operations for the operation of the computer 600, such as the routine 500 described above. The CPUs 602 may perform the operations by transitioning from one discrete, physical state to the next through the manipulation of switching elements that differentiate between and change these states. Switching elements may generally include electronic circuits that maintain one of two binary states, such as flip-flops, and electronic circuits that provide an output state based on the logical combination of the states of one or more other switching elements, such as logic gates. These basic switching elements may be combined to create more complex logic circuits, including registers, adders-subtractors, arithmetic logic units, floating-point units, and the like.

The computer 600 may also include a mass storage device 612. The mass storage device may be an optical disk, a magnetic storage device, or a solid state storage device. The mass storage device 612 may be operative to store one or more instructions to control a fuel cell discharge controller. In another configuration, the RAM 606, ROM 608, and the mass storage device 612 may be operative to have stored thereon, either alone or in various combinations, instructions for controlling a fuel cell discharge controller.

The computer 600 may store programs and data on the mass storage device 612 by transforming the physical state of the mass storage device 612 to reflect the information being stored. The specific transformation of physical state may depend on various factors, in different implementations of this disclosure. Examples of such factors may include, but are not limited to, the technology used to implement the mass storage device 612, whether the mass storage device 612 is characterized as primary or secondary storage, and the like.

For example, the computer 600 may store information to the mass storage device 612 by issuing instructions through a storage controller to alter the magnetic characteristics of a particular location within a magnetic disk drive device, the reflective or refractive characteristics of a particular location in an optical storage device, or the electrical characteristics of a particular capacitor, transistor, or other discrete component in a solid-state storage device. Other transformations of physical media are possible without departing from the scope and spirit of the present description, with the foregoing examples provided only to facilitate this description. The computer 600 may further read information from the mass storage device 612 by detecting the physical states or characteristics of one or more particular locations within the mass storage device 612.

The RAM 606, the ROM 608, or the mass storage device 612 may be operative as computer-readable storage mediums. Various aspects of the present disclosure may be stored on other types of computer-readable storage mediums, such as, but not limit to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 600. It should be understood that when the claims are interpreted in light of this present disclosure, a computer-readable storage medium does not include energy in the form of waves or signals.

The computer 600 also may include an input/output controller 616 for receiving and processing input from a number of other devices, including a keyboard, mouse, or electronic stylus. Similarly, the input/output controller 616 may provide an output to a display screen, a printer, or other type of output device. One or more embodiments may include a computer-readable storage medium manufactured so that, when read by a properly configured computing device, instructions may be provided to perform operations relating to designing an EMI filter for a shifted resonance point.

As used herein, the phrase "at least one of," when used with a list of items, means different combinations of one or more of the listed items may be used and only one of each item in the list may be needed. For example, "at least one of item A, item B, or item C" may include, without limitation, item A, item A and item B, or item B. This example also may include item A, item B, and item C or item B and item C. Of course, any combinations of these items may be present. In other examples, "at least one of" may be, for example, without limitation, two of item A, one of item B, and ten of item C; four of item B and seven of item C; and other suitable combinations. The item may be a particular object, thing, or a category. In other words, at least one of means any combination of items and number of items may be used from the list but not all of the items in the list are required.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

What is claimed is:

1. A computer-based method to design a motor drive system including switching mode power conversion equipment, the method comprising:
    selecting a software model representing a first configuration of the motor drive system, the first configuration comprising a motor controller, a feeder that couples the motor controller to an electric motor, and a first filter configuration of an electromagnetic interference (EMI) filter;
    determining a first weight value of a weight associated with the motor drive system if manufactured according to the first configuration;
    performing, on one or more computer processors, a simulation using the software model to determine a first resonant point for the first configuration of the motor drive system;
    selecting, upon determining that the first weight value does not meet a predefined weight requirement, a shifted resonant point that is at a higher frequency as compared to a frequency associated with the first resonant point;
    updating the software model to represent a second configuration of the motor drive system, wherein the second configuration of the motor drive system comprises a second filter configuration of the EMI filter that is selected such that the second configuration of the motor drive system corresponds to the shifted resonant point;
    determining a second weight value of the weight associated with the motor drive system if manufactured according to the second configuration; and
    manufacturing, upon determining that the second weight value meets the predefined weight requirement, the motor drive system according to the second configuration using the updated software model.

2. The method of claim 1, wherein selecting the shifted resonant point comprises using an impedance specification of the motor controller, the feeder, or the electric motor, or a combination thereof to shift from the first resonant point.

3. The method of claim 1, wherein the second filter configuration of the EMI filter includes added shielding for the feeder or added light passives along the feeder, or a combination thereof.

4. The method of claim 1, further comprising:
    updating the software model to represent a third configuration of the motor drive system in response to determining that the weight of the motor drive system with the second filter configuration of the EMI filter exceeds the second weight value,
    wherein the third configuration comprises one or both of an interleaved power controller and an active EMI noise cancellation mechanism.

5. The method of claim 1, wherein the motor controller is included in a plurality of interleaved motor controllers of the motor drive system, the method further comprising:
    changing an interleaving angle corresponding to the plurality of interleaved motor controllers to reduce selected harmonics of the motor drive system.

6. The method of claim 1, further comprising:
    based on the weight of the motor drive system, updating the software model to represent a third configuration of the motor drive system,
    wherein the third configuration comprises an active EMI noise cancellation mechanism for the motor drive system.

7. The method of claim 6, wherein the active EMI noise cancellation mechanism performs noise injection, converter paralleling, or a combination thereof.

8. The method of claim 1, wherein performing the simulation using the software model to determine the first resonant point comprises:
    applying a plurality of EMI frequencies within a predefined EMI frequency range; and
    measuring a combined impedance of the feeder and the electric motor for the EMI frequency range.

9. The method of claim 1, further comprising dynamically determining an interleaving angle and using an interleaving angle controller to adjust the interleaving angle for the motor controller.

10. A motor drive system for coupling to one or more electric motors, the motor drive system comprising:
    one or more motor controllers;
    one or more feeders coupled to the one or more motor controllers and to the one or more electric motors, wherein the one or more feeders are designed using an impedance specification that moves a resonant point of a combined impedance of the one or more feeders and the one or more electric motors to a shifted resonant point at a higher frequency as compared to a frequency of the resonant point; and
    one or more electromagnetic interference (EMI) filters that are coupled to the one or more motor controllers, wherein the one or more EMI filters are designed based for the shifted resonant point by:
        determining a first weight value of a weight associated with the motor drive system if manufactured according to a first EMI filter configuration;
        determining that the first weight value does not meet a predefined weight requirement;
        determining a second weight value of the weight associated with the motor drive system if manufactured according to a second EMI filter configuration that corresponds to the shifted resonant point; and
        manufacturing, upon determining that the second weight value meets the predefined weight requirement, the motor drive system according to the second EMI filter configuration.

11. The motor drive system of claim 10, wherein the one or more EMI filters comprise shielding, light passives, or a combination thereof, added along a portion of a length of the one or more feeders.

12. The motor drive system of claim 10, wherein at least one of the one or more motor controllers is a multifunctional motor controller.

13. The motor drive system of claim 10, further comprising:

an interleaving angle controller coupled to the one or more motor controllers and configured to adjust an interleaving angle of the one or more motor controllers.

14. The motor drive system of claim 13, wherein the interleaving angle controller adjusts the interleaving angle in response to a change of modes of the motor controller.

15. The motor drive system of claim 10, wherein the one or more controllers, the one or more feeders, the one or more electric motors, and the one or more EMI filters are located on an airplane.

16. A computer-readable storage medium having computer-executable instructions stored thereon that, when executed by a computer, cause the computer to:
  access a specification for a motor drive system that includes a motor controller model and a feeder model;
  determine, using the motor controller model and the feeder model, a first resonant point for a first configuration of the motor drive system;
  determine a first weight value of a weight associated with the motor drive system if manufactured according to the first configuration;
  determine that the first weight value does not meet a predefined weight requirement;
  determine impedance specifications to shift a resonant point for the motor drive system to a shifted resonant point at a higher frequency as compared to a frequency of the first resonant point;
  determine a second configuration of the motor drive system, wherein the second configuration comprises an electromagnetic interference (EMI) filter having a filter configuration selected such that the second configuration of the motor drive system corresponds to the shifted resonant point;
  determine a second weight value of the weight associated with the motor drive system if manufactured according to the second configuration; and
  manufacture, upon determining that the second weight value meets the predefined weight requirement, the motor drive system according to the second configuration.

17. The computer-readable storage medium of claim 16, wherein the motor drive system is for an airplane.

18. The computer-readable storage medium of claim 16, wherein the motor drive system comprises a plurality of motor controllers, wherein the instructions further cause the computer to:
  determine an interleaving angle corresponding to the plurality of motor controllers.

19. The computer-readable storage medium of claim 16, wherein the instructions further cause the computer to:
  determine whether to use active EMI noise cancellation in the motor drive system, wherein the active EMI noise cancellation performs noise injection, converter paralleling, or a combination thereof.

20. The computer-readable storage medium of claim 16, wherein the instructions further cause the computer to:
  determine, within a predefined EMI frequency range, a combined impedance of a feeder and a motor of the motor drive system; and
  determine resonant points of the motor drive system using the combined impedance.

* * * * *